(12) United States Patent
Motoyoshi

(10) Patent No.: US 6,998,665 B2
(45) Date of Patent: Feb. 14, 2006

(54) MAGNETIC MEMORY DEVICE AND MANUFACTURING METHOD THEREFOR

(75) Inventor: Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/475,459

(22) PCT Filed: Jan. 14, 2003

(86) PCT No.: PCT/JP03/00191

§ 371 (c)(1),
(2), (4) Date: Oct. 9, 2003

(87) PCT Pub. No.: WO03/069674

PCT Pub. Date: Aug. 21, 2003

(65) Prior Publication Data

US 2004/0137681 A1    Jul. 15, 2004

(30) Foreign Application Priority Data

Feb. 18, 2002 (JP) .............................. 2002-039468

(51) Int. Cl.
    *H01L 27/108* (2006.01)
(52) U.S. Cl. .............................. 257/300; 438/3; 257/295
(58) Field of Classification Search .................. 438/3; 257/295
    See application file for complete search history.

(56) References Cited

U.S. PATENT DOCUMENTS 5,729,410 A    3/1998  Fontana, Jr. et al.
6,211,035 B1 *  4/2001  Moise et al. ................. 438/396
6,444,542 B1 *  9/2002  Moise et al. ................. 438/448
6,627,913 B1 *  9/2003  Chen ........................... 257/10
6,635,499 B1 * 10/2003  Signorini ....................... 438/3
6,734,477 B1 *  5/2004  Moise et al. ................. 257/295

FOREIGN PATENT DOCUMENTS

| JP | 2001-052316 A | 2/2001 |
| JP | 2001-284679 A | 10/2001 |
| JP | 2002-124717 A | 4/2002 |
| WO | WO 00/38191 A1 | 6/2000 |

* cited by examiner

*Primary Examiner*—Thao P. Le
(74) *Attorney, Agent, or Firm*—Robert J. Depke; Trexler, Bushnell, Giangiorgi, Blackstone & Marr, Ltd.

(57) ABSTRACT

A magnetic memory device having a TMR element with high performance and high reliability, which can prevent oxidation or reduction of a tunnel dielectric layer in the TMR element. A nonvolatile magnetic memory device (1) includes a TMR element (13) configured by sandwiching a tunnel dielectric layer (303) between a ferromagnetic magnetization pinned layer (302) and a ferromagnetic storage layer (304), wherein information is stored by utilizing a change in resistance according to whether the direction of spins in the ferromagnetic layers (302) and (304) are parallel or antiparallel. The magnetic memory device (1) further includes a write word line (11) as a first wiring and a bit line (12) as a second wiring intersecting each other at different levels with the TMR element (13) interposed therebetween. The write word line (11) is electrically insulated from the TMR element (13), and the bit line (12) is electrically connected to the TMR element (13). The side surface of the TMR element (13) is covered with a side barrier layer (61) for blocking impurities.

2 Claims, 2 Drawing Sheets

MAGNETIC MEMORY DEVICE AND MANUFACTURING METHOD THEREFOR

This application claims priority to Japanese Patent Application Number JP2002-039468, filed Feb. 18, 2002, and WIPO Patent Application Number PCT/JP03/00191, filed Jan. 14, 2003, which are incorporated herein by reference.

TECHNICAL FIELD

The present invention relates to a magnetic memory device and a manufacturing method therefor, and more particularly to a nonvolatile magnetic memory device for recording information by utilizing a change in resistance according to whether the directions of spins in ferromagnetic layers constituting a tunnel magnetoresistive element are parallel or antiparallel, and also to a manufacturing method for such a nonvolatile magnetic memory device.

BACKGROUND ART

With a dramatic proliferation of information communications equipment, especially, personal compact equipment such as a mobile terminal, components of this equipment such as a memory device and a logic device are required to have higher performance such as higher integration, higher speed, and lower power consumption. In particular, a nonvolatile memory is considered to be an indispensable device in the ubiquitous age.

Even in the event of consumption or trouble of a power source, or line disconnection between a server and a network due to any failure, for example, the nonvolatile memory can protect personal important information. Increasing the storage density and capacity of the nonvolatile memory is becoming more important as a technique for substituting the nonvolatile memory for a hard disk or optical disk, which cannot substantially be made compact because of the presence of a movable part.

Further, recent mobile equipment is so designed as to suppress power consumption as low as possible by making an unnecessary circuit block in a standby state. In this respect, if a nonvolatile memory capable of serving both as a high-speed network memory and as a high-capacity storage memory can be realized, undue power consumption and memory can be eliminated. Further, a so-called instant-on function such that instantaneous starting is allowed at power-on can also become possible if a high-speed, high-capacity nonvolatile memory can be realized.

Examples of the nonvolatile memory include a flash memory using a semiconductor and an FRAM (Ferro electric Random Access Memory) using a ferroelectric material. However, the flash memory has a drawback such that the writing speed is as low as on the order of microseconds. On the other hand, as pointed out in the art, the FRAM has a problem such that the number of times of attainable rewriting is $10^{12}$ to $10^{14}$ and the durability is therefore low in comparison with a static random access memory or a dynamic random access memory. Another problem on the FRAM is that microforming of a ferroelectric capacitor is difficult.

Attention is being given to a magnetic memory device called an MRAM (Magnetic Random Access Memory) as a nonvolatile memory eliminating the above problems. The MRAM in early stages is based on a spin valve using an AMR (Anisotropic Magneto Resistive) effect reported in J. M. Daughton, "Thin Solid Films" Vol. 216 (1992), p. 162–168 or a GMR (Giant Magneto Resistance) effect reported in D. D. Tang et al., "IEDM Technical Digest" (1997), p. 995–997. However, such an early MRAM has a drawback such that the resistance of a memory cell as a load is as low as 10 Ω to 100 Ω, so that the power consumption per bit in reading is large to cause a difficulty of increasing the capacity.

In a TMR (Tunnel Magneto Resistance) effect reported in R. Meservey et al., "Pysics Reports" Vol. 238 (1994), p. 214–217, the resistance change rate is as low as 1% to 2%. However, as recently reported in T. Miyazaki et al., "J. Magnetism & Magnetic Material" Vol. 139 (1995), L231, a higher resistance change rate of about 20% has been obtained, and attention has been focused on the MRAM using the TMR effect.

The MRAM is simple in structure, so that high integration is easy to perform. Furthermore, recording is performed by rotation of magnetic moments, so that the number of times of attainable rewriting is expected to be large. In addition, the access time is also expected to be very short, and a high operation speed of 100 MHz has already been reported in R. Scheuerlein et al., "ISSCC Digest of Technical Papers" (February 2000), p. 128–129.

The MRAM using the TMR effect stores information by utilizing the fact that the tunnel resistance in an oxide film (tunnel oxide film) having a thickness of 0.5 nm to 5 nm sandwiched between ferromagnetic layers changes according to the directions of magnetization in these ferromagnetic layers. However, the tunnel resistance largely changes with the thickness of the tunnel oxide film. Accordingly, it is necessary to precisely uniform the thickness of the tunnel oxide film. Variations in thickness of the tunnel oxide film must be suppressed to about 3% to 5% depending on the scale of integration or the performance of a device.

The thickness of the tunnel oxide film varies not only in forming the tunnel oxide film, but also in a subsequent resist ashing step (K. Tsuji et al., "IEDM" (2001), p. 799) or in a sintering step using a forming gas. That is, reduction of the tunnel oxide film or oxidation of the ferromagnetic layers sandwiching the tunnel oxide film occurs because of the diffusion of hydrogen contained in an interlayer dielectric film or the diffusion of hydrogen or oxygen in the sintering step, thus resulting in variations in thickness of the tunnel oxide film. In the event that the thickness of the tunnel oxide film becomes too small, there arises a problem that the ferromagnetic layers may be short-circuited.

DISCLOSURE OF INVENTION

The present invention is a magnetic memory device and a manufacturing method therefor achieved to solve the above problem.

In accordance with an aspect of the present invention, there is provided a nonvolatile magnetic memory device including a tunnel magnetoresistive element configured by sandwiching a tunnel dielectric layer between ferromagnetics. Information is stored by utilizing a change in resistance according to whether the directions of spins in the ferromagnetics are parallel or antiparallel. The nonvolatile magnetic memory device further includes a first wiring and a second wiring intersecting each other at different levels with the tunnel magnetoresistive element interposed therebetween. The first wiring is electrically insulated from the tunnel magnetoresistive element. The second wiring is electrically connected to the tunnel magnetoresistive element. The nonvolatile magnetic memory device includes a side barrier layer formed on the side surface of the tunnel magnetoresistive element for blocking impurities.

In this magnetic memory device, the side surface of the tunnel magnetoresistive element is covered with the side barrier layer for blocking impurities. Accordingly, it is possible to prevent that hydrogen ions as a reducing substance and hydroxyl ions as an oxidizing substance may penetrate into the tunnel magnetoresistive element from its side surface. As a result, it is possible to avoid the problem that the film thickness of the tunnel dielectric layer of the tunnel magnetoresistive element is decreased by the reduction reaction due to the diffusion of hydrogen contained in an interlayer dielectric film or the diffusion of hydrogen in a sintering step using a forming gas, and the ferromagnetic layers are short-circuited through the tunnel dielectric layer in the event that the reduction reaction proceeds excessively. Further, it is also possible to avoid the problem that the film thickness of the tunnel dielectric layer is increased by the oxidation of the ferromagnetic layers sandwiching the tunnel dielectric layer therebetween.

In accordance with another aspect of the present invention, there is provided a manufacturing method for a nonvolatile magnetic memory device including a tunnel magnetoresistive element configured by sandwiching a tunnel dielectric layer between ferromagnetics. Information is stored by utilizing a change in resistance according to whether the directions of spins in the ferromagnetics are parallel or antiparallel. The manufacturing method includes the steps of forming the tunnel magnetoresistive element, forming a side barrier layer for blocking impurities on the side surface of the tunnel magnetoresistive element after the step of forming the tunnel magnetoresistive element, and forming a dielectric film for covering the tunnel magnetoresistive element after the step of forming the side barrier layer.

In this manufacturing method for the magnetic memory device, the side barrier layer for blocking impurity ions is formed on the side surface of the tunnel magnetoresistive element. Accordingly, it is possible to prevent that hydrogen ions as a reducing substance and hydroxyl ions as an oxidizing substance may penetrate into the tunnel magnetoresistive element from its side surface. As a result, it is possible to avoid the problem that the film thickness of the tunnel dielectric layer of the tunnel magnetoresistive element is decreased by the reduction reaction due to the diffusion of hydrogen generated from an interlayer dielectric film in a forming step for the interlayer dielectric film or the diffusion of hydrogen in a sintering step using a forming gas, and the ferromagnetic layers are short-circuited through the tunnel dielectric layer in the event that the reduction reaction proceeds excessively. Further, it is also possible to avoid the problem that the film thickness of the tunnel dielectric layer is increased by the oxidation of the ferromagnetic layers sandwiching the tunnel dielectric layer therebetween.

BEST MODE FOR CARRYING OUT THE INVENTION

A preferred embodiment of the magnetic memory device according to the present invention will now be described with reference to FIGS. 1 and 2.

Figure 1:
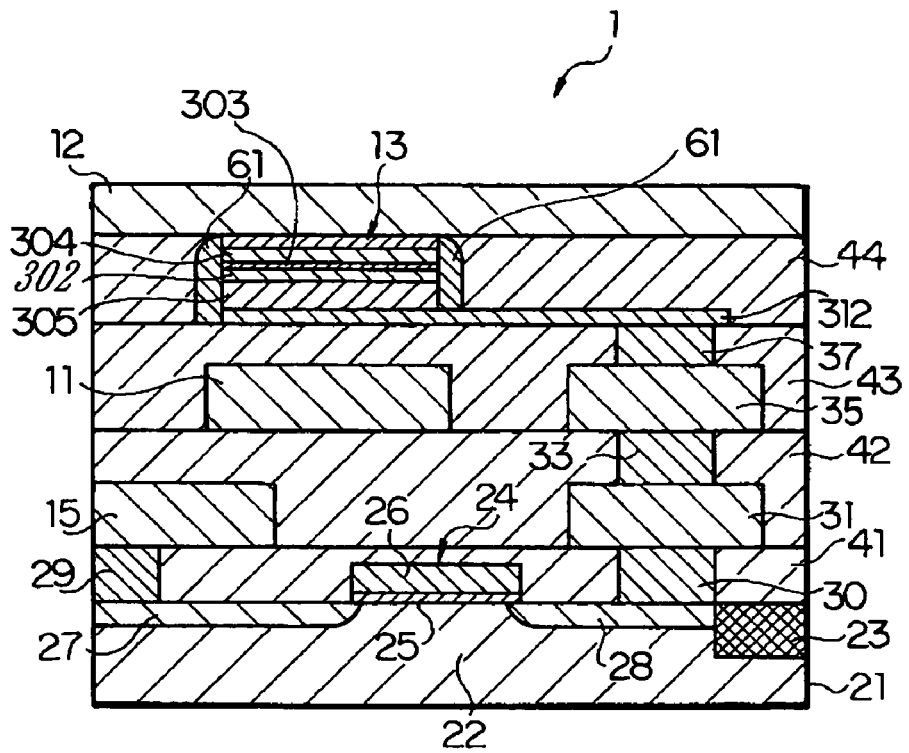
FIG. 1 is a schematic sectional view showing the configuration of a preferred embodiment according to the magnetic memory device of the present invention.
Figure 2:
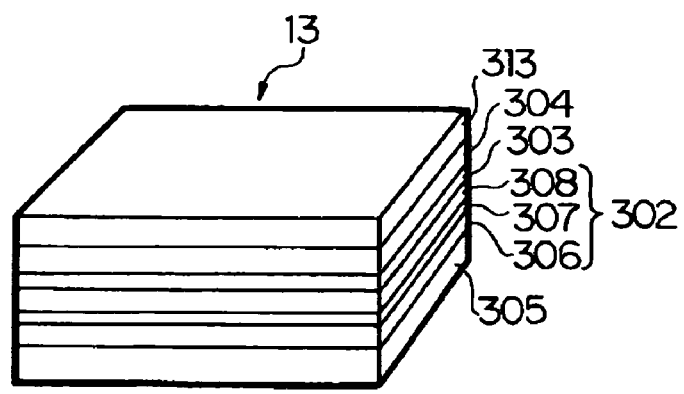
FIG. 2 is a schematic perspective view showing the configuration of an example of a TMR element.

As shown in FIG. 1, a p-type well region 22 is formed in the surface of a semiconductor substrate (e.g., p-type semiconductor substrate) 21. The p-type well region 22 is formed with an element isolation region 23 for isolating transistor forming regions from each other by so-called STI (Shallow Trench Isolation). A gate insulator 25 is formed on the p-type well region 22, and a gate electrode (word line) 26 is formed on the gate insulator 25. The p-type well region 22 is further formed with diffused layer regions (e.g., $N^+$ diffused layer regions) 27 and 28 on the opposite sides of the gate electrode 26. Thus, a field effect transistor 24 for selection is configured.

The field effect transistor 24 functions as a switching element for reading. The field effect transistor 24 may be provided by an n-type or p-type field effect transistor or various other switching elements such as a diode and a bipolar transistor.

A first dielectric film 41 is formed so as to cover the field effect transistor 24. The first dielectric film 41 is formed with contacts (e.g., tungsten plugs) 29 and 30 respectively connected to the diffused layer regions 27 and 28. A sense line 15 and a first landing pad 31 are formed on the first dielectric film 41 so as to be respectively connected to the contacts 29 and 30.

A second dielectric film 42 is formed on the first dielectric film 41 so as to cover the sense line 15 and the first landing pad 31. The second dielectric film 42 is formed with a contact (e.g., tungsten plug) 33 connected to the first landing pad 31. A write word line 11 and a second landing pad 35 connected to the contact 33 are formed on the second dielectric film 42.

A third dielectric film 43 is formed on the second dielectric film 42 so as to cover the write word line 11 and the second landing pad 35. The third dielectric film 43 is formed with a contact (e.g., tungsten plug) 37 connected to the second landing pad 35. An underlying conductor layer 312 is formed on the third dielectric film 43 so as to be connected to the contact 37 and extend to a position over the write word line 11. The underlying conductor layer 312 is formed of a conductive material. The underlying conductor layer 312 may be formed of a material similar to that of an antiferromagnetic layer.

The antiferromagnetic layer 305 is formed on the underlying conductor layer 312. An information storage element (which will be hereinafter referred to as TMR element) 13 is formed on the antiferromagnetic layer 305 over the write word line 11. The TMR element 13 is composed of a magnetization pinned layer 302 as a ferromagnetic layer, a tunnel dielectric layer 303 formed on the magnetization pinned layer 302, and a storage layer 304 as another ferromagnetic layer formed on the tunnel dielectric layer 303. That is, the TMR element 13 has such a configuration that the tunnel dielectric layer 303 is sandwiched between the magnetization pinned layer 302 and the storage layer 304. The TMR element 13 will be hereinafter described in detail.

A side barrier layer 61 like a sidewall is formed on the side surface of the TMR element 13. The side barrier layer 61 is formed of silicon nitride (e.g., plasma silicon silicon nitride) or aluminum oxide having a high barrier performance against hydrogen (inclusive of hydrogen ions), hydroxyl ions, oxygen, etc. The side barrier layer 61 is not necessarily required to cover the entire side surface of the TMR element 13, but is only required to cover the side surface of the tunnel dielectric layer 303 of the TMR element 13 and the side surface near the interface between the tunnel dielectric layer 303 and the storage layer 304.

A fourth dielectric film 44 is formed so as to cover the antiferromagnetic layer 305 and the TMR element 13. The upper surface of the fourth dielectric film 44 is planarized and the upper surface of the TMR element 13 is exposed to the upper surface of the fourth dielectric film 44. A bit line 12 as a second wiring is formed on the fourth dielectric film 44 so as to be connected to the upper surface of the TMR element 13. The bit line 12 intersects (e.g., orthogonally intersects) the write word line 11 at different levels with the TMR element 13 interposed therebetween.

An example of the TMR element 13 will now be described with reference to FIG. 2. As shown in FIG. 2, the magnetization pinned layer 302 is formed on the antiferromagnetic layer 305. The magnetization pinned layer 302 is composed of a first magnetization pinned layer 306, a conductor layer 307 formed on the first magnetization pinned layer 306, and a second magnetization pinned layer 308 formed on the conductor layer 307. The conductor layer 307 functions to antiferromagnetically couple the first and second magnetization pinned layers 306 and 308 as ferromagnetic layers. The tunnel dielectric layer 303 is formed on the magnetization pinned layer 302, and the storage layer 304 is formed on the tunnel dielectric layer 303. Further, a cap layer 313 is formed on the storage layer 304. While the magnetization pinned layer 302 has a multilayer structure consisting of two ferromagnetic layers and one conductor layer, the magnetization pinned layer in this present invention may be formed as a single ferromagnetic layer or may have a multilayer structure forming of three or more ferromagnetic layers and two or more conductor layers each sandwiched between the adjacent ferromagnetic layers.

The storage layer 304 and the first magnetization pinned layers 306 and 308 are formed of ferromagnetic materials such as nickel, iron, cobalt, and an alloy of at least two kinds of nickel, iron, and cobalt.

The conductor layer 307 is formed of ruthenium, copper, chromium, gold, or silver, for example.

The first magnetization pinned layer 306 is formed on the antiferromagnetic layer 305, so that exchange interaction occurs between these layers 305 and 306 and the first magnetization pinned layer 306 has strong unidirectional magnetic anisotropy.

The antiferromagnetic layer 305 is formed one of an iron-manganese alloy, nickel-manganese alloy, platinum-manganese alloy, iridium-manganese alloy, rhodium-manganese alloy, cobalt oxide, or nickel oxide, for example.

The tunnel dielectric layer 303 is formed of aluminum oxide, magnesium oxide, silicon oxide, aluminum nitride, magnesium nitride, silicon nitride, aluminum oxynitride, magnesium oxynitride, or silicon oxynitride, for example.

The tunnel dielectric layer 303 functions to break the magnetic coupling between the storage layer 304 and the magnetization pinned layer 302 and to pass a tunnel current. The above-mentioned magnetic films and conductor films are formed mainly by sputtering. The tunnel dielectric layer may be obtained by oxidation, nitridation, or oxynitridation of a metal film formed by sputtering.

The cap layer 313 is formed as an uppermost layer of the TMR element 13. The cap layer 313 has a function of preventing interdiffusion between the TMR element 13 and the wiring for connecting this TMR element 13 to another TMR element, a function of reducing contact resistance between the TMR element 13 and this wiring, and a function of preventing oxidation of the storage layer 304. The cap layer 313 is usually formed of copper, tantalum nitride, tantalum, or titanium nitride, for example. The antiferromagnetic layer 305 may serve also as the underlying conductor layer 312 for connecting the TMR element 13 and the switching element 24 in series (see FIG. 1).

The operation of the magnetic memory device 1 will now be described. The TMR element 13 operates to detect a change in tunnel current due to a magnetoresistive effect, thereby reading information. This effect depends on a relative magnetization direction between the storage layer 304 and the first and second magnetization pinned layers 306 and 308.

The TMR element 13 performs recording of "1" or "0" by passing currents through the bit line 12 and the write word line 11 to change the direction of magnetization in the storage layer 304 according to a resultant magnetic field due to these currents. Reading is performed by detecting a change in tunnel current due to a magnetoresistive effect. When the magnetization directions in the storage layer 304 and the magnetization pinned layers 306 and 308 are parallel to each other, the resistance is defined as a low value (e.g., "0"), whereas when the magnetization directions in the storage layer 304 and the magnetization pinned layers 306 and 308 are antiparallel to each other, the resistance is defined as a high value (e.g., "1").

In the magnetic memory device 1 according to the present invention, the side surface of the TMR element 13 is covered with the side barrier layer 61. Particularly, the side surface near the interface of the tunnel dielectric layer 303 and the storage layer 304 and the magnetization pinned payer 302 sandwiching the tunnel dielectric layer 303 are covered with the side barrier layer 61. The side barrier layer 61 is formed of silicon nitride or aluminum oxide having a high barrier performance against hydrogen (inclusive of hydrogen ions), hydroxyl ions, oxygen, etc. Accordingly, the TMR element 13 can be protected from the entrance of hydrogen (inclusive of hydrogen ions) or hydroxyl ions contained in an oxidizing atmosphere at starting of formation of the fourth dielectric film 44 or in the interlayer dielectric film. As a result, it is possible to suppress degradation in characteristics of the TMR element 13 and variations in film thickness of the tunnel dielectric layer 303.

In a magnetic memory device having such a configuration that the side barrier layer 61 is not formed on the side surface of the TMR element 13 as a comparison to the magnetic memory device 1 according to the present invention, the tunnel dielectric layer in the TMR element is reduced by hydrogen (inclusive of hydrogen ions ($H^+$)) or hydroxyl ions ($OH^-$) contained in a silicon oxide dielectric film for covering the TMR element. Usually, the silicon oxide dielectric film is provided by a P-TEOS (Plasma-Tetra EthoxySilane) film or HDP (High-Density Plasma CVD) film. In the worst case, the function as the tunnel dielectric layer may be lost. Further, especially the metal (or metal compound) film in the TMR element is oxidized in an oxidizing atmosphere immediately after starting the deposition of the silicon oxide dielectric film, causing variations in film thickness of the tunnel dielectric layer.

Figure 3A:
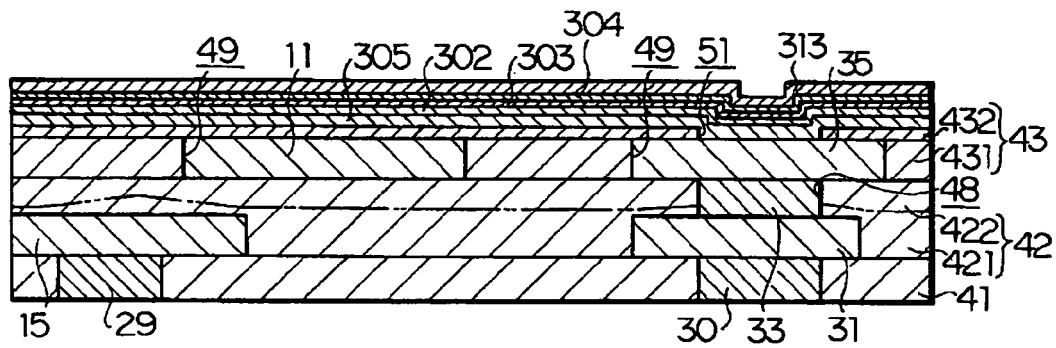
FIGS. 3A to 3C are schematic sectional views illustrating process steps of a preferred embodiment according to the manufacturing method for the magnetic memory device of the present invention.

There will now be described a preferred embodiment of the manufacturing method for the magnetic memory device according to the present invention with reference to FIGS. 3A to 3C.

First, a read circuit having a read transistor is formed on a semiconductor substrate (not shown), and a first dielectric film is formed on the semiconductor substrate so as to cover the read circuit. As shown in FIG. 3A, contacts 29 and 30 are next formed through the first dielectric film 41 so as to be respectively connected to diffused layers of the read transistor. Thereafter, a sense line 15 is formed on the first dielectric film 41 so as to be connected to the contact 29, and a first landing pad 31 is also formed on the first dielectric film 41 so as to be connected to the contact 30. Thereafter, a silicon oxide (P-TEOS) film (not shown) having a thickness of 100 nm, for example, is deposited on the first dielectric film 41 so as to cover the sense line 15 and the first landing pad 31 by plasma CVD using tetraethoxy silane as a raw material. Further, a silicon oxide (HDP) film 421 having a thickness of 800 nm, for example, is next deposited on the P-TEOS film by high-density plasma CVD, and a silicon oxide (P-TEOS) film 422 having a thickness of 1200 nm, for example, is next deposited on the HDP film 421 by plasma CVD. Thus, a second dielectric film 42 composed of the lower P-TEOS film, the HDP film 421, and the upper P-TEOS film 422 is formed. Thereafter, the second dielectric film 42 is planarized by chemical mechanical polishing, for example, so that a thickness of 700 nm, for example, is left on the first landing pad 31.

In the next step, a plasma silicon nitride (P—SiN) film having a thickness of 20 nm, for example, is deposited on the planarized second dielectric film 42 by plasma CVD to form an etching stopper layer (not shown). Thereafter, a resist coating step, lithographic step, and etching step are sequentially performed to open a via hole pattern through the etching stopper layer 47.

In the next step, a P-TEOS film having a thickness of 300 nm, for example, is deposited on the etching stopper layer so as to fill the via hole pattern, thereby forming a lower layer 431 of a third dielectric film 43. Thereafter, a resist coating step, lithographic step, and etching step are sequentially performed to form wiring trenches 49 in the lower third dielectric film 431 and to also open a via hole 48 reaching the first landing pad 31 in the second dielectric film 42. This etching step is performed under the conditions that the silicon oxide is selectively etched with respect to the silicon nitride.

In the next step, a tantalum nitride film or tantalum film having a thickness of 20 nm, for example, is deposited on the inner surfaces of the via hole 48 and the wiring trenches 49 by PVD (Physical Vapor Deposition) and a titanium film having a thickness of 5 nm is next deposited on this tantalum nitride film or tantalum film by PVD, thus forming a barrier metal layer (not shown).

In the next step, a copper film having a thickness of 80 nm is deposited by sputtering, and copper is next deposited so as to fill via the hole 48 and the wiring trenches 49 by electroplating. Thereafter, excess portions of the tungsten and the barrier metal layer deposited on the lower third dielectric film 431 are removed by chemical mechanical polishing to form a write word line 11 and a second landing pad 35 each composed of the copper with the underlying barrier metal layer in the wiring trenches 49 and to form a plug 50 composed of the copper with the underlying barrier metal layer in the via hole 48.

Thereafter, a P-TEOS film having a thickness of 100 nm, for example, is deposited on the lower third dielectric film 431 to form an upper layer 432 of the third dielectric film 43 covering the write word line 11 and the second landing pad 35. Thus, the upper third dielectric film 432 covering the write word line 11 and the second landing pad 35 is formed of a P-TEOS film.

The above-mentioned process is merely illustrative, and any modifications may be made in the present invention. For example, the sense line 15 and the first landing pad 31 may be formed by a trench wiring technique, and the write word line 11 and the second landing pad 35 may be formed by a usual wiring technique.

Thereafter, a resist coating step and a lithographic step are sequentially performed to form a mask (not shown) on the upper third dielectric film 43, and an etching step is next performed by using this mask to form a via hole 51 reaching the second landing pad 35.

In the next step, a barrier layer (not shown), an antiferromagnetic layer 305, a magnetization pinned layer 302 of ferromagnetic material, a tunnel dielectric layer 303, a storage layer 304 of ferromagnetic material, and a cap layer 313 are sequentially deposited by PVD (Physical Vapor Deposition).

The barrier layer may be formed of titanium nitride, tantalum, or tantalum nitride, for example. The antiferromagnetic layer 305 may be formed of a manganese alloy such as iron-manganese alloy, nickel-manganese alloy, palladium-manganese alloy, or iridium-manganese alloy.

The magnetization pinned layer 302 may be formed of a ferromagnetic alloy material such as nickel-iron alloy, cobalt-iron alloy, or other cobalt alloys. In the magnetization pinned layer 302, the direction of magnetization is pinned by the exchange coupling between this layer 302 and the antiferromagnetic layer 305. As mentioned above with reference to FIG. 2, the magnetization pinned layer 302 may have a multilayer structure composed of ferromagnetic layers and a conductor layer sandwiched therebetween.

The tunnel dielectric layer 303 may be formed of aluminum oxide, for example. The tunnel dielectric layer 303 is required to usually have a very small film thickness of about 0.5 to 5 nm. Therefore, this layer 303 is formed by plasma oxidation of a deposited film formed by ALD (Atomic Layer Deposition) or sputtering, for example.

The storage layer 304 is formed of a ferromagnetic alloy material such as nickel-iron alloy or cobalt-iron alloy. In the storage layer 304, the direction of magnetization can be changed into a direction parallel or antiparallel to the direction of magnetization in the magnetization pinned layer 302 by applying an external magnetic field to the TMR element 13.

The cap layer 313 may be formed of tungsten, tantalum, or titanium nitride, for example.

Figure 3B:
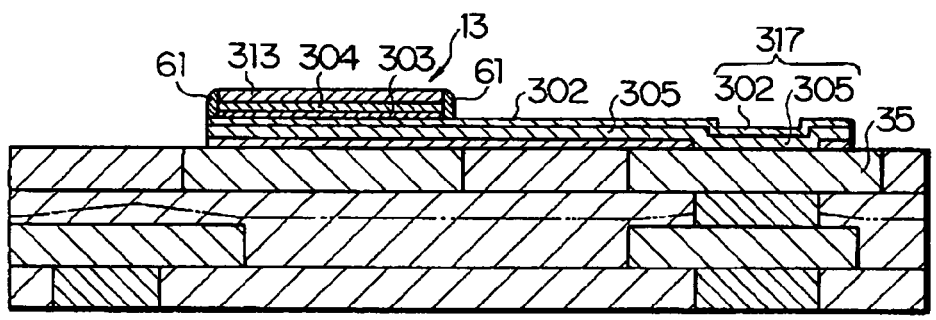

As shown in FIG. 3B, a resist coating step and a lithographic step are sequentially performed to form a mask (not shown) on the cap layer 313, and an etching step (e.g., reactive ion etching) is next performed by using this mask to etch the cap layer 313. Thereafter, this resist mask is removed by ashing, for example, and the above-mentioned multilayer film (e.g., the storage layer 304, the tunnel dielectric layer 303, the magnetization pinned layer 302, and the antiferromagnetic layer 305) for forming a TMR element is next etched by using the cap layer 313 as a mask to form the TMR element 13. In FIG. 3B, the storage layer 304 and the tunnel dielectric layer 303 are etched. The end point of this etching is set at a point between the tunnel dielectric layer 303 and the antiferromagnetic layer 305. In FIG. 3B, the etching is ended at a point on the magnetization pinned layer 302. As an etching gas for this etching, a composite gas obtained by adding ammonia ($NH_3$) to halogen gas including chlorine (Cl) or carbon monoxide (CO) may be used.

In the next step, a silicon nitride (e.g., plasma-silicon silicon nitride) film for forming a side barrier layer 61 is deposited so as to cover the TMR element 13 by CVD, for example. Thereafter, this silicon nitride film is entirely etched back to leave the P-silicon nitride film on the side surface of the TMR element 13 in a manner of forming a sidewall, thereby forming the side barrier layer 61. This side barrier layer 61 must be formed on at least the side surface of the tunnel dielectric layer 303 and the interface between the tunnel dielectric layer 303 and the storage layer 304. Further, it is sufficient that the side barrier layer 61 be formed from a dielectric film having a high barrier performance against hydrogen (inclusive of hydrogen ions), hydroxyl ions, oxygen, etc. For example, the side barrier layer 61 may be formed from an aluminum oxide film rather than the above-mentioned silicon nitride film. Further, the deposition method for the side barrier layer 61 is not limited, but any deposition methods allowing the deposition on the side surface of the TMR element 13 may be adopted. For example, sputtering may be adopted to form the side barrier layer 61.

Thereafter, a resist mask is formed by a resist coating technique and a lithographic technique, and the remaining TMR material deposited on the third dielectric film 43 is etched by reactive ion etching using this resist mask to form a bypass line 317 for connecting the TMR element 13 and the second landing pad 35 by using a part of the multilayer film for formation of the TMR element 13. In FIG. 3B, the bypass line 317 is composed mainly of the magnetization pinned layer 302, the antiferromagnetic layer 305, and the barrier layer formed on the third dielectric film 43.

Figure 3C:
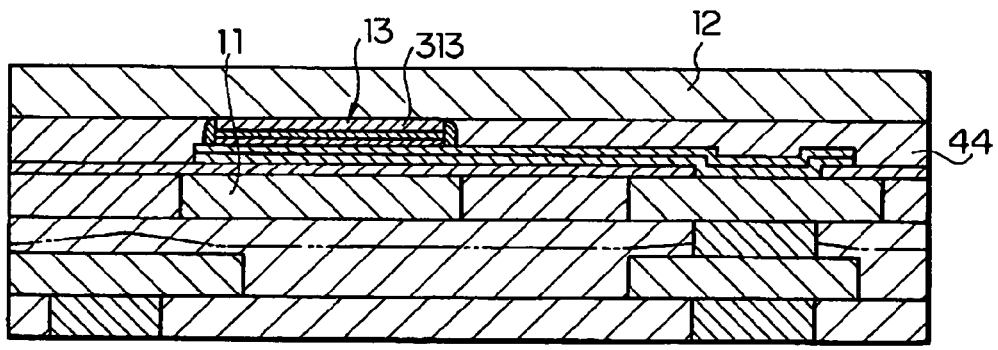

As shown in FIG. 3C, a fourth dielectric film 44 of silicon oxide or aluminum oxide is formed on the entire surface of the third dielectric film 43 so as to cover the TMR element 13 and the bypass line 317 by CVD or PVD. At this time, there is no possibility that the side surface of the TMR element 13 may be exposed to an oxidizing atmosphere at starting the deposition of the fourth dielectric film 44, because the side surface of the TMR element 13 is covered with the side barrier layer 61 of silicon nitride or aluminum oxide. Thereafter, the surface of the fourth dielectric film 44 deposited is planarized by chemical mechanical polishing, and the cap layer 313 as the uppermost layer of the TMR element 13 is exposed at the same time.

In the next step, a bit line 12 intersecting the write word line 11 at different levels with the TMR element 13 interposed therebetween so as to be connected to the TMR element 13, a peripheral circuit wiring (not shown), and a bonding pad region (not shown) are formed on the fourth dielectric film 44 by a standard wiring technique. Thereafter, a fifth dielectric film (not shown) of plasma silicon nitride is formed over the entire surface, and the bonding pad portion (not shown) is opened to complete the wafer process for an LSI.

In the manufacturing method for the magnetic memory device, the side barrier layer 61 capable of blocking impurity ions is formed on the side surface of the TMR element 13. Accordingly, it is possible to prevent that hydrogen ions as a reducing substance and hydroxyl ions as an oxidizing substance may penetrate into the TMR element 13 from its side surface. As a result, it is possible to avoid the problem that the film thickness of the tunnel dielectric layer 303 of the TMR element 13 is decreased by the reduction reaction due to the diffusion of hydrogen generated from the fourth dielectric film 44 in the step of forming the fourth dielectric film 44 or the diffusion of hydrogen in a sintering step using a forming gas, and the magnetization pinned layer 302 and the storage layer 304 are short-circuited through the tunnel dielectric layer 303 in the event that the reduction reaction proceeds excessively. Further, it is also possible to avoid the problem that the film thickness of the tunnel dielectric layer 303 is increased by the oxidation of the magnetization pinned layer 302 and the storage layer 304 sandwiching the tunnel dielectric layer 303 therebetween.

The configuration of the dielectric films mentioned above is merely illustrative, and any other dielectric film configurations capable of attaining electrical insulation between the elements and between the wirings may be adopted. Further, the values for the film thicknesses of the various films mentioned above are also merely illustrative, and suitable values may be set.

According to the magnetic memory device of the present invention as described above, the side surface of the TMR element is covered with the side barrier layer having a high barrier performance against hydrogen (inclusive of hydrogen ions), hydroxyl ions, oxygen, etc. Accordingly, it is possible to prevent oxidation of the TMR element in an oxidizing atmosphere just after starting of the deposition of the dielectric film for covering the TMR element, and it is also possible to prevent oxidation or reduction of the TMR element by hydrogen (inclusive of hydrogen ions) or hydroxyl ions contained in this dielectric film, thereby suppressing a degradation in characteristics of the TMR element and an increase in variations in tunnel resistance. Accordingly, it is possible to provide a magnetic memory device including a TMR element with no degradation in characteristics and a high reliability.

According to the manufacturing method for the magnetic memory device of the present invention as described above, the side barrier layer having a high barrier performance against hydrogen (inclusive of hydrogen ions), hydroxyl ions, oxygen, etc. is formed on the side surface of the TMR element. Accordingly, it is possible to prevent oxidation of the TMR element in an oxidizing atmosphere just after starting of the deposition of the dielectric film for covering the TMR element, and it is also possible to prevent oxidation or reduction of the TMR element by hydrogen (inclusive of hydrogen ions) or hydroxyl ions contained in this dielectric film, thereby suppressing a degradation in characteristics of the TMR element and an increase in variations in tunnel resistance. Accordingly, it is possible to manufacture a magnetic memory device including a TMR element with no degradation in characteristics and a high reliability.

The invention claimed is:

1. A nonvolatile magnetic memory device including a tunnel magnetoresistive element configured by sandwiching a tunnel dielectric layer between ferromagnetics, wherein information is stored by utilizing a change in resistance according to whether the directions of spins in said ferromagnetics are parallel or antiparallel;

said nonvolatile magnetic memory device further including a first wiring and a second wiring intersecting each other at different levels with said tunnel magnetoresistive element interposed there between;

said first wiring being electrically insulated from said tunnel magnetoresistive element;

said second wiring being electrically connected to said tunnel magnetoresistive element;

said tunnel magnetoresistive element comprising a cap layer, an upper ferromagnetic layer, a tunnel dielectric layer, and a lower ferromagnetic layer such that said lower ferromagnetic layer extends in a horizontal plane beyond the upper magnetic layer and the tunnel dielectric layer; and further comprising a side barrier layer for blocking impurities formed on side surfaces of said tunnel dielectric layer and said cap layer and extending in the vertical direction from said cap layer to an upper surface of said lower ferromagnetic layer.

2. A nonvolatile magnetic memory device according to claim 1, wherein a silicon dioxide dielectric layer is formed adjacent to said tunnel magnetoresistive element.

* * * * *